United States Patent
Kim et al.

(10) Patent No.: US 10,490,676 B2
(45) Date of Patent: Nov. 26, 2019

(54) METHOD OF MANUFACTURING OXIDATION LAYER FOR SOLAR CELL

(71) Applicant: LG ELECTRONICS INC., Seoul (KR)

(72) Inventors: Hyunjin Kim, Seoul (KR); Daeyeong Gong, Seoul (KR); Bokyeom Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/794,430

(22) Filed: Oct. 26, 2017

(65) Prior Publication Data
US 2018/0240917 A1    Aug. 23, 2018

(30) Foreign Application Priority Data
Feb. 23, 2017    (KR) .................. 10-2017-0024418

(51) Int. Cl.
    *H01L 31/0216*    (2014.01)
    *H01L 31/028*    (2006.01)
    *H01L 21/02*    (2006.01)
    *H01L 31/18*    (2006.01)

(52) U.S. Cl.
CPC .. *H01L 31/02167* (2013.01); *H01L 21/02164* (2013.01); *H01L 21/02236* (2013.01); *H01L 31/028* (2013.01); *H01L 31/1804* (2013.01); *H01L 31/1864* (2013.01); *H01L 31/1868* (2013.01); *H01L 31/1876* (2013.01); *Y02E 10/547* (2013.01); *Y02P 70/521* (2015.11)

(58) Field of Classification Search
CPC ............ H01L 31/02167; H01L 31/028; H01L 21/02164; H01L 21/02236
See application file for complete search history.

(56) References Cited

U.S. PATENT DOCUMENTS

| | | | |
|---|---|---|---|
| 6,555,407 B1* | 4/2003 | Chitica ................... | B01J 3/006 257/E21.286 |
| 7,468,485 B1* | 12/2008 | Swanson ........... | H01L 31/03682 136/243 |
| 7,838,400 B2* | 11/2010 | Borden ............. | H01L 31/02168 257/E21.042 |
| 2001/0031562 A1* | 10/2001 | Raaijmakers ..... | H01L 21/02238 438/770 |
| 2004/0045580 A1* | 3/2004 | Kurita ....................... | B08B 3/08 134/3 |
| 2008/0160785 A1* | 7/2008 | Shin .................. | H01L 21/02238 438/787 |
| 2009/0167993 A1* | 7/2009 | Chen .................... | G02B 5/3083 349/96 |

(Continued)

FOREIGN PATENT DOCUMENTS

| | | |
|---|---|---|
| JP | 11-186255 A | 7/1999 |
| JP | 2013-12566 A | 1/2013 |

(Continued)

*Primary Examiner* — Sonya D. McCall-Shepard
(74) *Attorney, Agent, or Firm* — Birch, Stewart, Kolasch & Birch, LLP

(57) ABSTRACT

A method of manufacturing an oxidation layer for a solar cell is disclosed. The method includes exposing a substrate to a wet oxidation atmosphere and forming an oxidation layer on the substrate by maintaining a concentration of an oxidizing agent in the wet oxidation atmosphere for a process time.

13 Claims, 6 Drawing Sheets

(56) References Cited

U.S. PATENT DOCUMENTS

| | | | | |
|---|---|---|---|---|
| 2009/0188553 | A1* | 7/2009 | Dubin | C23C 18/1608 |
| | | | | 136/256 |
| 2017/0179325 | A1* | 6/2017 | Chung | H01L 31/02167 |
| 2017/0236954 | A1* | 8/2017 | Kramer | H01L 31/02167 |
| | | | | 136/256 |
| 2017/0316953 | A1* | 11/2017 | Zhang | H01L 21/28 |
| 2018/0062008 | A1* | 3/2018 | Xie | H01L 31/02246 |

FOREIGN PATENT DOCUMENTS

| | | |
|---|---|---|
| JP | 2013-26571 A | 2/2013 |
| JP | 5724718 B2 | 5/2015 |
| KR | 10-2013-0095191 A | 9/2013 |
| WO | WO 2010/052541 A2 | 5/2010 |
| WO | WO 2012/003038 A2 | 1/2012 |

\* cited by examiner

FIG. 7

| X (cm) | Y (cm) | O₃ concentration : 10ppm | | | O₃ concentration : 12ppm | | | O₃ concentration : 15ppm | | |
|---|---|---|---|---|---|---|---|---|---|---|
| | | Dipping time : 200sec | | | Dipping time : 250sec | | | Dipping time : 200sec | | |
| | | | | | | | | | | |
| 0 | 6 | 1.29 | 1.29 | 1.48 | 1.36 | 1.31 | 1.36 | 1.44 | 1.44 | 1.4 |
| 3.5 | 3.5 | 1.29 | 1.27 | 1.47 | 1.36 | 1.32 | 1.37 | 1.42 | 1.43 | 1.36 |
| 0 | 3.5 | 1.3 | 1.29 | 1.46 | 1.34 | 1.3 | 1.36 | 1.44 | 1.43 | 1.36 |
| -3.5 | 3.5 | 1.31 | 1.3 | 1.46 | 1.35 | 1.29 | 1.35 | 1.43 | 1.43 | 1.4 |
| -6 | 0 | 1.32 | 1.31 | 1.47 | 1.35 | 1.32 | 1.35 | 1.39 | 1.45 | 1.41 |
| -3.5 | 0 | 1.31 | 1.3 | 1.48 | 1.33 | 1.3 | 1.35 | 1.44 | 1.44 | 1.4 |
| 0 | 0 | 1.3 | 1.28 | 1.46 | 1.34 | 1.31 | 1.34 | 1.42 | 1.43 | 1.39 |
| 3.5 | 0 | 1.29 | 1.28 | 1.44 | 1.36 | 1.31 | 1.34 | 1.42 | 1.43 | 1.4 |
| 6 | 0 | 1.28 | 1.29 | 1.45 | 1.35 | 1.31 | 1.36 | 1.42 | 1.43 | 1.37 |
| 3.5 | -3.5 | 1.28 | 1.27 | 1.44 | 1.34 | 1.33 | 1.36 | 1.41 | 1.42 | 1.37 |
| 0 | -3.5 | 1.28 | 1.27 | 1.46 | 1.34 | 1.32 | 1.35 | 1.42 | 1.43 | 1.4 |
| -3.5 | -3.5 | 1.29 | 1.28 | 1.45 | 1.32 | 1.29 | 1.35 | 1.45 | 1.43 | 1.42 |
| 0 | -6 | 1.29 | 1.29 | 1.5 | 1.35 | 1.32 | 1.36 | 1.44 | 1.44 | 1.42 |
| avg | | 1.29 | 1.29 | 1.46 | 1.35 | 1.31 | 1.35 | 1.43 | 1.43 | 1.39 |
| max | | 1.32 | 1.31 | 1.5 | 1.36 | 1.33 | 1.37 | 1.45 | 1.45 | 1.42 |
| min | | 1.28 | 1.27 | 1.44 | 1.32 | 1.29 | 1.34 | 1.39 | 1.39 | 1.36 |
| range | | 0.04 | 0.04 | 0.06 | 0.04 | 0.04 | 0.03 | 0.06 | 0.06 | 0.06 |
| unif(%) | | 1.5% | 1.6% | 2.1% | 1.5% | 1.5% | 1.1% | 2.1% | 2.1% | 2.2% | ns
METHOD OF MANUFACTURING OXIDATION LAYER FOR SOLAR CELL

CROSS-REFERENCE TO RELATED APPLICATION

This application claims the benefit of Korean Patent Application No. 10-2017-0024418 filed on Feb. 23, 2017, the entire disclosure of which are hereby incorporated by reference herein for all purposes.

BACKGROUND OF THE INVENTION

Field of the Invention

Embodiments of the invention relate to a method of manufacturing an oxidation layer formed of an oxide on a surface of a substrate used for a solar cell.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

Solar cells are manufactured using a substrate having a pn junction, and thin layers such as a passivation layer and an antireflection layer are formed on a substrate by using a semiconductor processing technique in order to increase power generation efficiency.

Since the power generation efficiency is the most important indicator of the power generation performance of solar cells, various attempts and studies have been made by many manufacturers to increase their efficiency. One of them is related to an oxidation layer.

The oxidation layer formed with a thin thickness acts as a kind of barrier to electrons and holes, minority carriers are prevented from passing therethrough, only majority carriers having an energy above a certain level after they are accumulated in adjacent portions of the oxidation layer can be collected into an electrode through the silicon oxidation layer, thereby increasing the efficiency of the solar cell.

A typical method of forming an oxidation layer on a silicon substrate is a dry oxidation method using a tube furnace. However, in this method, a thickness of the layer formed on the substrate is not uniform and uniformity of the layer is lowered depending on a position of the substrate in the tube furnace, and a growth rate of the layer is slow. Also, since the process is performed at a high temperature, severe thermal stress is applied to the substrate.

SUMMARY OF THE INVENTION

The invention has been made in view of the above technical background and provides a new manufacturing method for forming an oxidation layer.

In one aspect, there is provided a method of manufacturing an oxidation layer for a solar cell including exposing a substrate to a wet oxidation atmosphere and forming an oxidation layer on the substrate by maintaining a concentration of an oxidizing agent in the wet oxidation atmosphere for a process time.

The forming the oxidation layer may be performed at room temperature, and a pressure of the wet oxidation atmosphere may be 1.1 to 1.3 atm.

The concentration of the oxidizing agent may be 3 to 100 ppm, and the substrate may be exposed to the wet oxidation atmosphere for 30 to 600 seconds.

The oxidizing agent may be any one selected from $O_2$, $H_2O$ and $O_3$.

The wet oxidation atmosphere may be formed by pressurizing and spraying $O_2$ gas having a purity of 99.9% or less alone or by mixing $N_2$ gas with $O_2$ gas having a purity of 99.9% or more and pressurizing and spraying the mixed gas.

The method of manufacturing the oxidation layer may further include performing a hydrophobic treatment the substrate before the exposing.

The method of manufacturing the oxidation layer may further include a saw damage etching (SDE) process for etching a saw damage of the substrate before the performing the hydrophobic treatment. The performing the hydrophobic treatment and the SDE process may be performed in-situ.

The forming the oxidation layer may be performed in-situ with the SDE process.

The method of manufacturing the oxidation layer may further include heating the oxidation layer at about 600° C.

The substrate may be a silicon substrate and the oxidation layer may be a silicon oxidation layer ($SiO_2$). A thickness of the oxidation layer may be 0.5 nm to 2 nm.

The method of manufacturing the oxidation layer may further include after the forming the oxidation layer, drying the substrate with hot air at a temperature lower than 60° C.

In another aspect, there is provided a method of manufacturing an oxidation layer for a solar cell including preparing ozonated water having an ozone concentration of 5 to 18 ppm and forming an oxidation layer having a thickness of 0.5 nm to 2 nm on a surface of a silicon substrate by dipping the silicon substrate in the ozonated water for 100 to 500 seconds.

BRIEF DESCRIPTION OF THE DRAWINGS

FIG. 7 illustrates results of experiments for evaluating a layer quality of an oxidation layer grown by a method of manufacturing an oxidation layer according to anther embodiment of the invention.

DETAILED DESCRIPTION OF THE EMBODIMENTS

Figure 1:
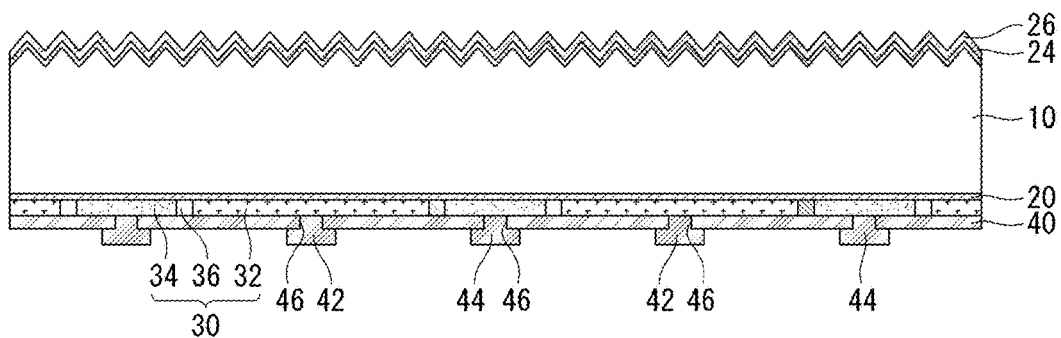
FIGS. 1 and 2 illustrate examples of a solar cell having a silicon oxidation layer formed thereon.

Reference will now be made in detail to embodiments of the invention, examples of which are illustrated in the accompanying drawings.

This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention. In addition, the various embodiments shown in the drawings are illustrative and may not be drawn to scale to facilitate illustration. The shape or structure can also be illustrated by simplicity.

A method of manufacturing a solar cell according to an embodiment of the invention relates to a method of forming an oxidation layer. More particularly, the invention relates to a method of forming a silicon oxidation layer on a surface of a crystalline substrate, and FIGS. 1 and 2 illustrate examples of a solar cell having a silicon oxidation layer formed thereon.

Figure 2:
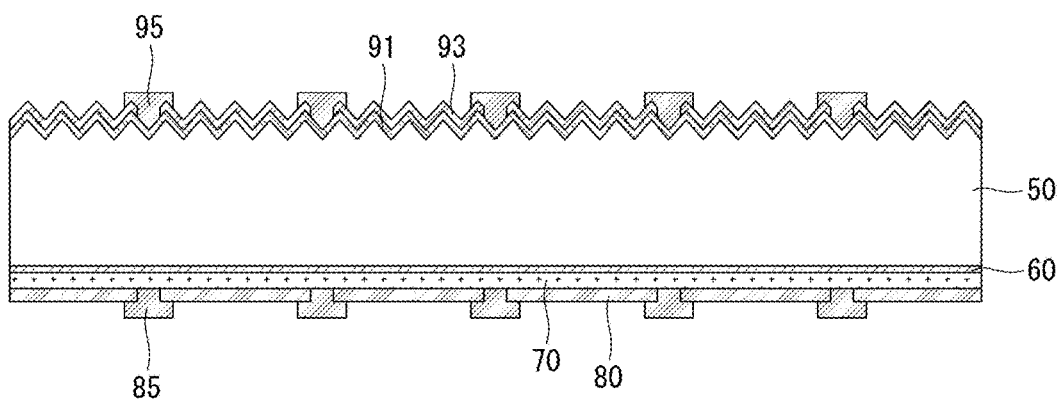

FIGS. 1 and 2 illustrate a solar cell having an oxidation layer formed thereon. In FIGS. 1 and 2, the oxidation layer is formed of a silicon oxidation layer ($SiO_2$) and is respectively located on a back surface of the solar cell.

In FIG. 1, the solar cell has a back contact type structure in which all electrodes 42 and 44 are present on the back surface of the solar cell.

Referring to FIG. 1, in the back contact type solar cell, a control passivation layer 20 formed of an oxidation layer is formed on a surface of a substrate 10, and a polycrystalline silicon layer 30 is disposed thereon.

The electrodes 42 and 44 are formed so as to contact an n+ region 34 and a p+ region 32 through a contact hole 46 formed in a passivation layer 40 made of a dielectric layer such as silicon nitride, respectively.

An insulating layer 24 and an antireflection layer 26 may be sequentially formed on a front surface of the substrate 10. These are made of dielectric layers in the same or similar to the passivation layer 40.

The substrate 10 may be made, for example, of a single crystal silicon wafer containing n-type impurities.

The control passivation layer 20 is formed to directly contact an entire back surface of the substrate 10. The control passivation layer 20 may be formed with a thin thickness of about 0.5 to 2 nm so that carriers generated in the substrate 10 can be tunneled. In addition, the control passivation layer 20 passivates the back surface of the substrate 10. The control passivation layer 20 promotes quantum tunneling so that the carriers generated by the pn junction can quickly diffuse toward the electrodes. In addition, the control passivation layer 20 also acts as a potential barrier of minority carriers to prevent the minority carriers from diffusing too much into a semiconductor layer 30 from the substrate 10. Preferably, the control passivation layer 20 is made of the silicon oxidation layer such as $SiO_2$, and the thickness of the control passivation layer 20 is preferably a thin thickness of 0.5 nm to 2 nm in which tunneling effect is effectively formed.

The n+ region 34 and the p+ region 32 are regions doped with n-type impurities and p-type impurity at high concentration, respectively. The p+ region 32 forms a pn junction with the substrate 10 to produce a carrier by photoelectric effect. An intrinsic region 36 is formed between the n+ region 34 and the p+ region 32 to prevent them from being shunted.

The semiconductor layer 30 may be formed by depositing an amorphous silicon layer on the control passivation layer 20 using a well-known deposition method in the semiconductor field, and then crystallizing the polycrystalline silicon layer by heat treatment at a temperature of about 600° C.

The passivation layer 40 is further formed on the semiconductor layer 30, and first and second electrodes 42 and 44 are formed to come into contact with the n+ region 34 and the p+ region 32 through the passivation layer 40.

In FIG. 2, a solar cell may have a bifacial structure capable of receiving light on a front surface and a back surface, respectively.

Referring to FIG. 2, in the solar cell, a control passivation layer 60 formed of an oxidation layer is formed on a back surface of a substrate 50, and a polycrystalline silicon layer 70 is disposed thereon. The polycrystalline silicon layer 70 can form a back surface field region including high concentration n-type impurities.

In the same manner as described above, the polycrystalline silicon layer 70 may be formed by depositing an amorphous silicon layer on the control passivation layer 60 using a deposition method, and then crystallizing the polycrystalline silicon layer by heat treatment at a temperature of about 600° C.

A second electrode 85 is formed to contact the polycrystalline silicon layer 70 through a passivation layer 80 covering the polycrystalline silicon layer 70.

A front surface of the substrate 50 includes an emitter 91 including high concentration p-type impurities and an antireflection layer 93 formed on the emitter 91. The antireflection layer 93 may passivate a surface of the substrate 50.

A first electrode 95 is formed to contact the emitter 91 through the antireflection layer 93.

Figure 3:
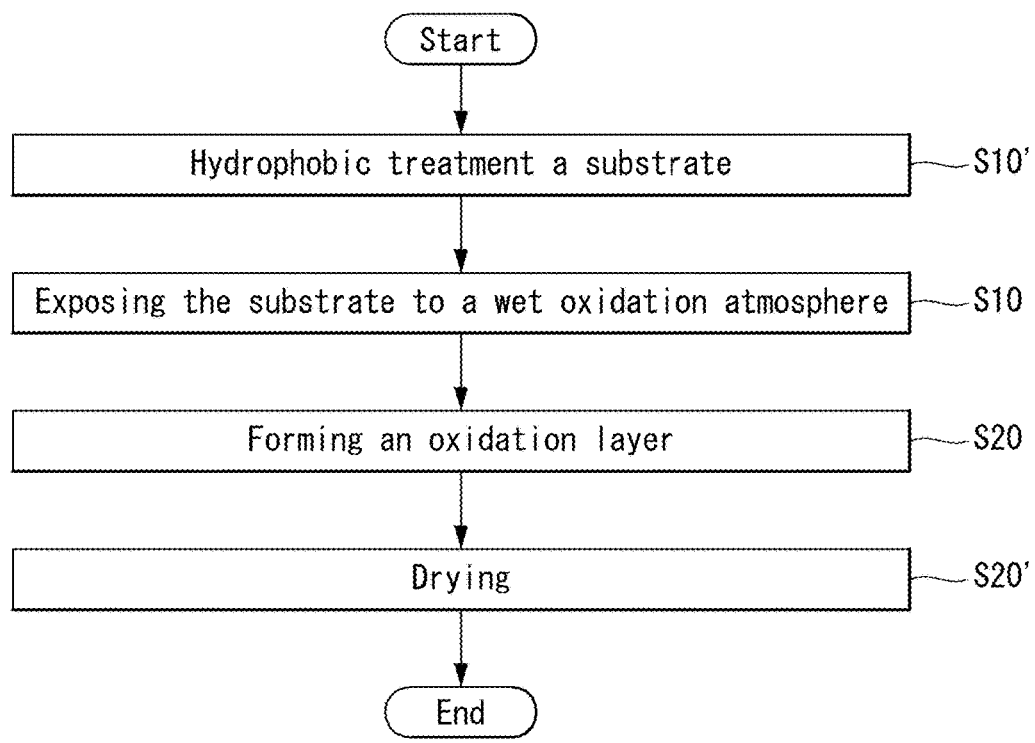
FIG. 3 is a flowchart illustrating a method of manufacturing an oxidation layer for a solar cell according to an embodiment of the invention.

Hereinafter, a method of manufacturing an oxidation layer for a solar cell according to a first embodiment of the invention will be described in detail with reference to the accompanying drawings. The manufacturing method according to an embodiment of the invention may include a step S10 of exposing a substrate to a wet oxidation atmosphere and a step S20 of forming an oxidation layer on the substrate by maintaining a concentration of an oxidizing agent in the wet oxidation atmosphere for a process time (see FIG. 3).

Here, the wet oxidation atmosphere is a state in which a certain space (hereinafter, referred to as a cavity) is filled with liquid fine oxidizing agent particles and is wet. The wet oxidation atmosphere can be formed at a pressure of about 1.1 to 1.3 atm, slightly higher than the atmospheric pressure, at a concentration of an oxidizing agent of 3 to 100 ppm, and at room temperature. This wet oxidation atmosphere can be prepared by various methods. For example, a gaseous oxidizing agent may be pressurized and dispersed in the space, or a liquid oxidizing agent may be vaporized or heated to form a wet oxidation atmosphere.

The manufacturing method of this embodiment can be performed using the same equipment as an etching equipment used in a saw damage etching (SDE) process of chemically wet removing a saw damage generated in a process of manufacturing a substrate. This etching equipment is also used in a process of removing an oxidation layer (phosphoric silicate glass layer) formed on a surface of the substrate.

As is well known, in a SDE process, a substrate is immersed in a basic solution to etch its surface, and then the substrate is immersed in an acid solution to remove impurities remaining on the surface of the substrate. In the SDE process, a wet etching equipment called a bath in the art is used. The manufacturing method according to an embodiment of the invention can be performed using this bath used in the SDE process.

The SDE process is performed by filling a plurality of etching equipments with a basic solution or an acid solution, respectively, immersing a substrate in the solution for about 200 to 300 seconds, and etching a surface of the substrate.

In an automated equipment, approximately 7 baths are used in the SDE process. The substrate is loaded on a housing member called a carrier. The housing member can be transferred by a mechanical device called a transfer unit.

When an equipment used in the SDE process is the same as an equipment used to form the oxidation layer, because an in-situ process that the SDE process and the oxidation layer formation process are continuously performed is possible, in addition to reducing manufacturing time, it has been possible to form a high-quality oxidation layer by using relatively less expensive equipment than a tube furnace, which is generally used for dry oxidation up to now. Therefore, manufacturing cost can be effectively reduced.

Figure 4:
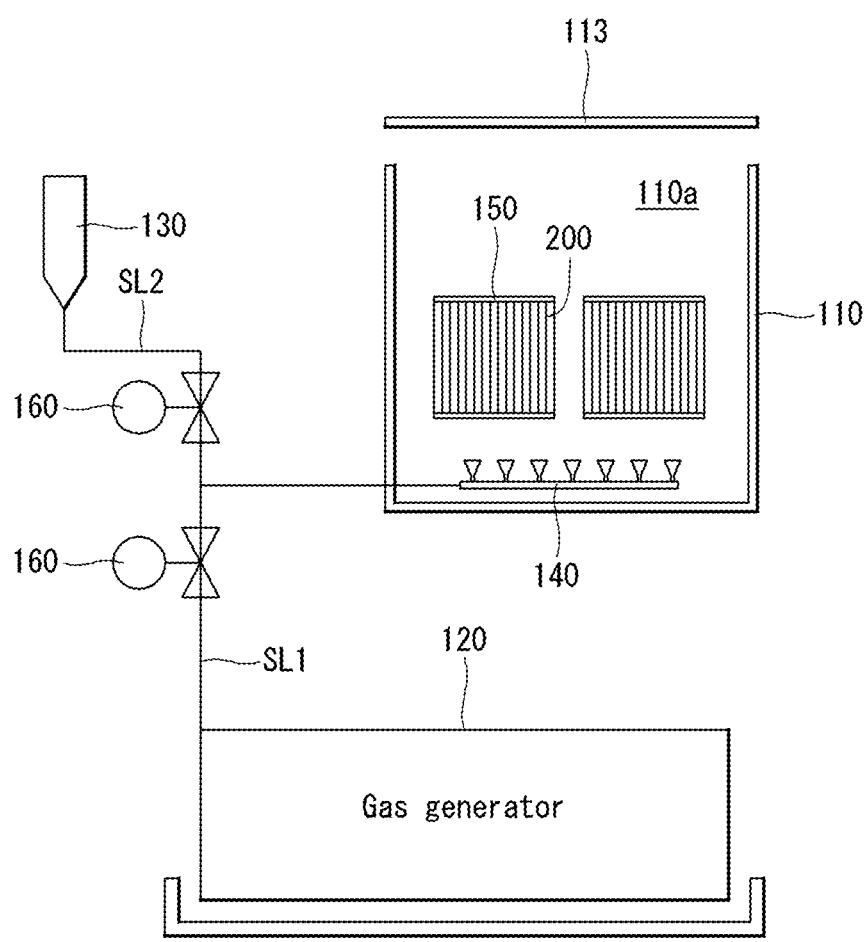
FIG. 4 is a view illustrating a schematic configuration of an etching equipment used in a SDE process.

A schematic configuration of an etching equipment used in a SDE process is shown in FIG. 4. Referring to FIG. 4, the etching equipment includes a body 110 having a cavity 110a, a gas generator 120, and a nitrogen supply unit 130.

A nozzle unit 140 for supplying the gas generated from the gas generator 120 to the cavity 110a may be further installed inside the body 110.

Substrates are loaded with several tens to hundreds of sheets on a housing member called a carrier 150 and loaded into the inside of the body 110. The carrier 150 is also configured to be loaded/unloaded by a mechanical device called a transfer unit (not shown).

A valve 160 is installed in a supply line SL1 for connecting between the gas generator 120 and the nozzle unit 140 and a supply line SL2 for connecting between the nitrogen supply unit 130 and the nozzle unit 140, respectively. Therefore, it is possible to control the supply of gas to the cavity 110a of the body 110.

A door 113, which is opened and closed by a mechanical device, is provided at an entrance of the body 110, so that the cavity 110a can be opened or closed.

Further, since the manufacturing method of the invention is performed in the same environment as the environment in which the etching equipment operates in the SDE process, the invention can also be performed at room temperature and atmospheric pressure. Therefore, a thermal stress problem, which is one of problems of a conventional dry oxidation method, can be fundamentally prevented.

Further, in the manufacturing method of the invention, since an oxidizing agent gas having a fine particle size is used, a uniform oxidizing agent is supplied to an entire substrate, and an oxidation layer of excellent layer quality can be formed.

In an embodiment of the invention, the method may further include a step S10' of performing a hydrophobic treatment the substrate before the step S10. When water molecules are present on a surface of the substrate made of silicon, the water molecules react with the substrate to form a natural oxidation layer. Therefore, a uniformity of the layer is reduced when the oxidation layer is formed.

The hydrophobic treatment of the substrate can be performed by immersing the substrate in a hydrofluoric acid solution (HF) having a hydrofluoric acid concentration of 1% to 10% for 180 seconds to 600 seconds, and the temperature is preferably room temperature. The same bath as the bath used in the SDE process is used as an equipment in the hydrophobic treatment of the substrate.

Further, in an embodiment of the invention, the method may further include a step S20' of drying the substrate after step S20.

In this step S20', the drying of the substrate may be performed by removing water, which may be remained, by shooting hot air on the substrate. Since the silicon substrate is naturally oxidized at a temperature of about 60° C. or more to form an oxidation layer on the surface of the substrate, this step S20' prevents the formation of the natural oxidation layer by drying the substrate as much as possible. The drying of the substrate is preferably performed at a temperature lower than about 60° C., at which the natural oxidation layer is formed.

In an embodiment, after the drying step, the method may further include a step of heating the oxidation layer. This heating step is preferably performed simultaneously in a process of depositing an amorphous silicon layer on the substrate and converting it into a polysilicon layer by heating at about 600° C. or a process of chemical vapor deposition of a polysilicon layer on the substrate. However, the invention is not limited thereto. This heating step may be performed separately from formation of the polysilicon layer.

Hereinafter, a manufacturing method according to an embodiment of the invention using the etching equipment shown in FIG. 4 will be described in detail.

In step S10', a substrate 200 surface-etched through the SDE process is immersed in the body 110 in which a hydrofluoric acid solution is contained. At this time, the surface-etched substrates 200 may be loaded with several tens to several hundreds of sheets on the carrier 150 as described above, and may be loaded into the body 110 by the transfer unit.

In step S10, the carrier 150 on which the substrates 200 are loaded is unloaded from a first bath containing the hydrofluoric acid solution by the transfer unit, and is loaded into a new second bath. The substrates 200 are loaded into the body 110 of the second bath. The inside of the body 110 is preferably a dry atmosphere. Here, the dry atmosphere refers to a state in which the inside of the body 110 is dried. As described above, it is necessary to maintain the dry atmosphere to prevent a surface of the substrate from being oxidized naturally, thereby enabling precise control of a thickness of the layer.

In step S20, when the substrates 200 are loaded into the body 110, the door 113 is closed and the gas generator 120 is operated to supply an oxidizing agent gas to the inside of the body 110, that is, the cavity 110a through the supply line SL1. At this time, the oxidizing agent gas is supplied through the nozzle unit 140 existing in the body 110. A pressurized oxidizing agent gas is injected through the nozzle unit 140 so that the cavity 110a can be formed into a wet oxidation atmosphere. At this time, it is preferable that the oxidizing agent gas is injected with an injection pressure of 0.1 to 0.5 Mpa. If the injection pressure is less than 0.1 Mpa or greater than 0.5 Mpa, the oxidizing agent gas to be sprayed may not be evenly supplied to the surface of the substrate.

The oxidizing agent gas supplied to the body 110 through the gas generator 120 may be any one selected from $O_2$, $H_2O$ and $O_3$, or more preferably, the ozone $O_3$ may be used as an oxidizing agent. When a purity of oxygen gas supplied to the gas generator 120 is higher than 99.9%, it is preferable to add nitrogen ($N_2$) gas. When a purity of oxygen gas is lower than 99.9%, the oxygen gas may be used alone. When a purity of oxygen gas is higher than 99.9%, it is difficult to control a growth rate of the layer. When high purity oxygen gas having a purity of 99.9% or more is used, the nitrogen gas may be mixed at a ratio of 1000 (oxygen): 1 to 10 (nitrogen).

Due to the injection pressure of the oxidizing agent gas, the cavity 110a has a pressure of about 1.1 to 1.3 atm, which is slightly higher than the atmospheric pressure, and an ozone $O_3$ concentration is preferably 3 to 100 ppm. When the ozone concentration is higher or lower than this, it is difficult to form a layer by controlling a thickness of the oxidation layer to be a desired thickness range of 0.5 to 2 nm.

Further, it is preferable that the substrate 200 is exposed to the wet oxidation atmosphere for 30 to 600 seconds.

In step S20', the operation of the gas generator 120 is stopped to stop the supply of the oxidizing agent gas supplied to the cavity, and the door 113 is opened to discharge the oxidizing agent gas filling the cavity 110a.

The transfer unit transports the carrier to a hot air furnace to expose the substrate 200 at a temperature lower than 60° C. Accordingly, the water that may remain on the substrate 200 can be completely removed in step S20'. At this time, since the carrier is also dried, it is possible to prevent contamination of the equipment caused by water falling from the carrier in a subsequent process.

Figure 5:
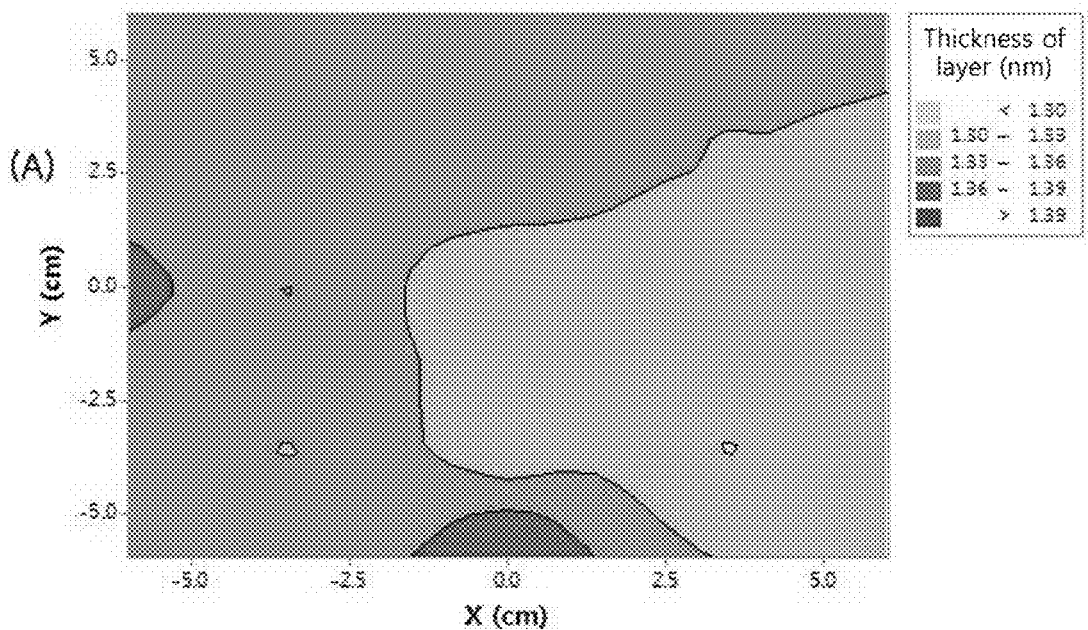
FIG. 5 illustrates results of experiments for evaluating a layer quality of an oxidation layer grown by a method of manufacturing an oxidation layer according to an embodiment of the invention.

FIG. 5 illustrates results of experiments for evaluating a layer quality of an oxidation layer grown by a method of manufacturing an oxidation layer according to an embodiment of the invention described above. FIG. 5(A) is a contour diagram according to a thickness, and FIG. 5(B) illustrates a thickness of a layer depending on a position.

In this experiment, a substrate is a single crystal silicon wafer for monitoring. This single crystal silicon wafer for monitoring has a surface polished differently from a substrate used to manufacture actual solar cells. Since this experiment is an experiment to evaluate uniformity of the layer depending on a position, and a substrate that is not polished has a rough surface, a substrate for monitoring which is polished is used. In the experiment, the layer is grown for 5 minutes using ozone gas 10 ppm using the above-described bath.

As a result, a grown silicon oxidation layer was grown to a minimum thickness of 1.31 nm and a maximum thickness of 1.39 nm, and an average thickness of 1.34 nm. The uniformity of the layer at this time is 3.367%, and the uniformity of the layer is a value obtained by the following equation 1.

Uniformity of layer (Unif)=(maximum thickness−minimum thickness)/(2×average thickness)  [Equation 1]

As described above, according to a manufacturing method according to a second embodiment of the invention, although the silicon oxidation layer is grown for a short time at room temperature and atmospheric pressure, a high-quality layer having a very good thickness deviation can be grown.

Hereinafter, a method of manufacturing an oxidation layer according to a second embodiment of the invention will be described. In this embodiment, a substrate is dipped in ozonated water ($O_3$) at room temperature and atmospheric pressure to form an oxidation layer on a surface of the substrate. At this time, concentration of ozone contained in the ozonated water used is 5 to 18 ppm, more preferably 10 to 15 ppm. The time for which the substrate is dipped in the ozonated water is preferably 100 to 500 seconds. There is some variation depending on a concentration condition of the ozonated water. However, when the process time is out of 100 to 500 seconds, it is difficult to form an oxidation layer having a desired thickness.

The manufacturing method according to a second embodiment of the invention includes a step S100 of preparing ozonated water having an ozone concentration of 5 to 18 ppm and a step S200 of dipping a substrate in the ozonated water for 100 to 500 seconds.

In addition, the manufacturing method of this embodiment may further include a hydrophobic treatment step S100' performed before step S100 and a drying step S200' performed after step S200. These steps may be performed in the same manner as described above.

The manufacturing method of this embodiment can also be performed in the above-described bath, and thus can be performed in-situ with the SDE process.

Figure 6:
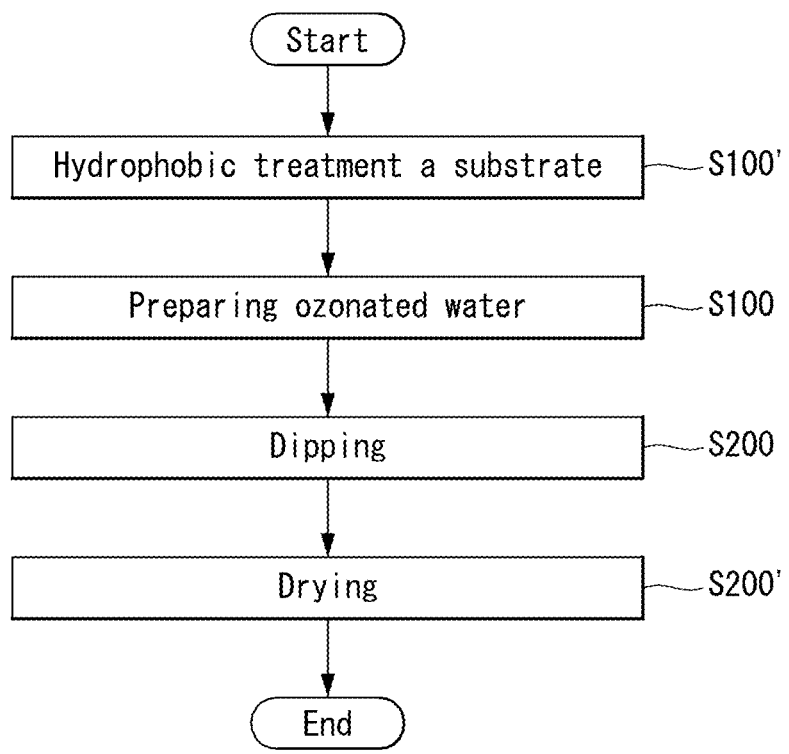
FIG. 6 is a flowchart illustrating a method of manufacturing an oxidation layer according to anther embodiment of the invention.

FIG. 6 illustrates a method of manufacturing an oxidation layer according to a second embodiment of the invention. FIG. 7 illustrates an experimental result of growing an oxidation layer by a method of manufacturing an oxidation layer according to a second embodiment of the invention and evaluating a uniformity of a layer.

In this experiment, a single crystal silicon wafer for monitoring is used as a substrate, and the experiment is performed three times for each of three instances. Experimental example 1 has an ozone concentration of 10 ppm and a dipping time of 200 seconds. Experimental example 2 has an ozone concentration of 12 ppm and a dipping time of 250 seconds. Experimental example 3 has an ozone concentration of 15 ppm and a dipping time of 200 seconds. In the table, X and Y indicate positions where thicknesses are measured, respectively.

In a first experiment (#1) of experimental example 1, an average thickness of a layer is 1.29 nm and a uniformity of a layer is 1.5%. In a second experiment (#2) of experimental example 1, an average thickness of a layer is 1.29 nm and a uniformity of a layer is 1.6%. In a third experiment (#3) of experimental example 1, an average thickness of a layer is 1.46 nm and a uniformity of a layer is 2.1%.

Compared with experimental example 1, in a first experiment (#4) of experimental example 2, an average thickness of a layer is 1.35 nm and a uniformity of a layer is 1.5%. In a second experiment (#5) of experimental example 2, an average thickness of a layer is 1.31 nm and a uniformity of a layer is 1.5%. In a third experiment (#6) of experimental example 2, an average thickness of a layer is 1.35 nm and a uniformity of a layer is 1.1%.

Further, in a first experiment (#7) of experimental example 3, an average thickness of a layer is 1.43 nm and a uniformity of a layer is 2.1%. In a second experiment (#8) of experimental example 3, an average thickness of a layer is 1.43 nm and a uniformity of a layer is 2.1%. In a third experiment (#9) of experimental example 3, an average thickness of a layer is 1.39 nm and a uniformity of a layer is 2.2%.

Further, according to results obtained by integrating experimental examples 1 to 3, a thickness of an oxidation layer is 1.3 to 1.4 nm and a uniformity of a layer is 1.7%.

In comparison, when an oxidation layer is formed according to a conventional dry oxidation method, a thickness of a layer is about 1.36 nm, and a uniformity of a layer is 4.2%.

As described above, according to the second embodiment of the invention, it can be seen that it is possible to form an oxidation layer having an excellent layer quality compared to a related art.

In addition, according to the manufacturing method of the second embodiment of the invention, a better quality oxidation layer can be grown as compared with the first embodiment. In particular, when an ozone concentration is 12 ppm and a dipping time is 250 seconds, an oxidation layer having excellent conditions can be grown.

Based on these results, in the manufacturing method according to the second embodiment of the invention, it can be seen that the ozone concentration is most preferably 10 to 15 ppm and the dipping time is most preferably between 200 and 250 seconds.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an oxidation layer for a solar cell using an etching facility equipped with a plurality of baths to remove a saw damage from a substrate by wet etching, the method comprising:
   removing the saw damage of the substrate by using the etching facility;
   forming a wet oxidation atmosphere by filling any one of the plurality of baths of the etching facility with an oxidation vapor; and
   forming an oxidation layer on the substrate by exposing the substrate to the wet oxidation atmosphere at room temperature,
   wherein a pressure of the wet oxidation atmosphere is 1.1 to 1.3 atm,
   wherein the substrate is a silicon substrate and the oxidation layer is a silicon oxidation layer ($SiO_2$), and
   wherein a thickness of the oxidation layer is 0.5 nm to 2 nm.

2. The method of claim 1, wherein a concentration of an oxidizing agent in the oxidation vapor is 3 to 100 ppm.

3. The method of claim 1, wherein the substrate is exposed to the wet oxidation atmosphere for 30 to 600 seconds.

4. The method of claim 1, wherein an oxidizing agent in the oxidation vapor is any one selected from $O_2$, $H_2O$ and $O_3$.

5. The method of claim 1, wherein the wet oxidation atmosphere with the oxidation vapor is formed by pressurizing and spraying $O_2$ gas having a purity of 99.9% or less alone.

6. The method of claim 1, wherein the wet oxidation atmosphere with the oxidation vapor is formed by mixing $N_2$ gas with $O_2$ gas having a purity of 99.9% or more and pressurizing and spraying the mixed gas.

7. The method of claim 1, further comprising:
   performing a hydrophobic treatment to the substrate before the forming of the wet oxidation atmosphere.

8. The method of claim 7, wherein the performing of the hydrophobic treatment and the removing of the saw damage are performed in-situ.

9. The method of claim 7, wherein the forming of the oxidation layer is performed in-situ with the removing of the saw damage.

10. The method of claim 1, further comprising:
    heating the oxidation layer at about 600° C.

11. The method of claim 1, further comprising:
    after the forming of the oxidation layer, drying the substrate with hot air at a temperature lower than 60° C.

12. The method of claim 1, wherein the oxidation vapor is formed by vaporizing or heating a liquid oxidizing agent.

13. The method of claim 1, wherein an oxidizing agent in the oxidation vapor is injected with an injection pressure of 0.1 to 0.5 Mpa.

* * * * *